United States Patent
Low

(10) Patent No.: US 9,912,353 B1
(45) Date of Patent: Mar. 6, 2018

(54) SYSTEMS AND METHODS FOR GENERATING SOFT INFORMATION IN A FLASH DEVICE

(71) Applicant: Marvell International Ltd., Hamilton (BM)

(72) Inventor: Seo-How Low, San Jose, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 15/066,330

(22) Filed: Mar. 10, 2016

Related U.S. Application Data

(63) Continuation of application No. 14/285,349, filed on May 22, 2014, now Pat. No. 9,286,155.

(60) Provisional application No. 61/827,154, filed on May 24, 2013.

(51) Int. Cl.
| | |
|---|---|
| *G11C 29/00* | (2006.01) |
| *H03M 13/11* | (2006.01) |
| *G11C 29/50* | (2006.01) |
| *G06F 11/10* | (2006.01) |

(52) U.S. Cl.
CPC ..... *H03M 13/1111* (2013.01); *G06F 11/1072* (2013.01); *G11C 29/50004* (2013.01); *G11C 2029/5004* (2013.01)

(58) Field of Classification Search
CPC .. G06F 11/1008; G06F 11/1048; G06F 11/10; G06F 12/0246; G06F 11/1068; G06F 2212/2002; H03M 13/1111; H03M 13/1102; G11C 16/3404; G11C 29/52; G11C 16/3418; G11C 11/5642; G11C 16/26; G11C 7/02; G11C 7/04; G11C 16/0483; G11C 2211/5634
See application file for complete search history.

(56) References Cited

U.S. PATENT DOCUMENTS

| | | | |
|---|---|---|---|
| 9,007,854 B1* | 4/2015 | Nemati Anaraki ..... | G06F 11/10 365/189.09 |
| 9,086,982 B1* | 7/2015 | Xu ....................... | G06F 11/0751 |
| 9,092,350 B1* | 7/2015 | Jeon ..................... | G06F 11/004 |
| 2009/0234792 A1* | 9/2009 | Kim ..................... | G06N 99/005 706/50 |
| 2010/0131827 A1* | 5/2010 | Sokolov .............. | G06F 11/1072 714/763 |
| 2010/0165730 A1* | 7/2010 | Sommer ............. | G06F 11/1068 365/185.03 |
| 2010/0199149 A1* | 8/2010 | Weingarten ......... | G06F 11/1068 714/773 |
| 2011/0225350 A1* | 9/2011 | Burger, Jr. ........... | G11C 7/02 711/103 |
| 2012/0236638 A1* | 9/2012 | Weingarten ......... | G11C 11/5628 365/185.2 |

(Continued)

*Primary Examiner* — Guerrier Merant

(57) ABSTRACT

Systems and methods are provided for generating a soft information metric corresponding to a bit stored in a memory. The systems and methods include comparing a symbol value associated with the stored bit to a plurality of decision thresholds to obtain a plurality of binary values. One of the plurality of binary values is selected to obtain a reference value. Further, a frequency metric is computed, which corresponds to the number of times each of the plurality of binary values equals a predefined value. The soft information metric is then determined based on the frequency metric and the reference value.

20 Claims, 10 Drawing Sheets

(56) References Cited

U.S. PATENT DOCUMENTS

| | | | |
|---|---|---|---|
| 2013/0290612 A1* | 10/2013 | Weathers | G11C 16/3454 711/103 |
| 2013/0318422 A1* | 11/2013 | Weathers | G06F 11/08 714/780 |
| 2014/0040704 A1* | 2/2014 | Wu; Yunxiang | G11C 29/52 714/773 |
| 2014/0219028 A1* | 8/2014 | Alhussien | G11C 16/3418 365/185.18 |
| 2014/0237318 A1* | 8/2014 | Fitzpatrick | G06F 11/1012 714/763 |
| 2014/0281767 A1* | 9/2014 | Alhussien | G11C 16/3404 714/721 |
| 2015/0149818 A1* | 5/2015 | Kalavade | G06F 11/073 714/6.13 |

* cited by examiner

300 →

| | Region 1 (302a) | Region 2 (302b) | Region 3 (302c) | Region 4 (302d) |
|---|---|---|---|---|
| 304a — Threshold 1 | 1 | 0 | 0 | 0 |
| 304b — Threshold 0 | 1 | 1 | 0 | 0 |
| 304c — Threshold 2 | 1 | 1 | 1 | 0 |
| 306 — Freq. metric | 0 | 1 | 2 | 3 |
| 308 — Reference value | 1 | 1 | 1 | 0 |

350 →

| | Region 1 (352a) | Region 2 (352b) | Region 3 (352c) | Region 4 (352d) | Region 5 (352e) | Region 6 (352f) | Region 7 (352g) |
|---|---|---|---|---|---|---|---|
| 354a — Threshold 1 | 1 | 0 | 0 | 0 | 1 | 1 | 1 |
| 354b — Threshold 0 | 1 | 1 | 0 | 0 | 0 | 1 | 1 |
| 354c — Threshold 2 | 1 | 1 | 1 | 0 | 0 | 0 | 1 |
| 356 — Freq. metric | 0 | 1 | 2 | 3 | 2 | 1 | 0 |
| 358 — Reference value | 1 | 1 | 1 | 0 | 0 | 0 | 1 |

FIG. 3

SYSTEMS AND METHODS FOR GENERATING SOFT INFORMATION IN A FLASH DEVICE

CROSS REFERENCE TO RELATED APPLICATION

This application is a continuation of U.S. patent application Ser. No. 14/285,349, filed on May 22, 2014 (allowed), which claims the benefit under 35 U.S.C. § 119(e) of U.S. Provisional Application No. 61/827,154, filed on May 24, 2013, both of which are incorporated herein by reference in their respective entireties.

FIELD OF USE

The present disclosure relates generally to systems and methods for generating soft information in storage systems, such as storage systems using flash memory. The soft information may be used by a decoder to reduce the number of read errors.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The disclosed technology relates to data storage systems, and more particularly, to generating soft information for the decoding of data in flash memories.

In a data storage system, it is desirable for information, often grouped in blocks or sectors, to be accurately stored and retrieved. A decoder, either integrated within or external to the data storage system, processes a signal retrieved from the data storage device. The medium, or media, on which the data is stored may corrupt the retrieved signal such that the decoder is unable to correctly reconstruct the stored information. Accordingly, given a storage medium, sufficient reliability is obtained through careful design of the data storage system and/or the decoder, and of their respective components.

The input to a decoder may include different types of information about the symbols that are to be decoded. For example, the information may include hard information, soft information, or a combination of both. Hard information generally corresponds to a single symbol value, selected from a set of admissible values, any one of which could be associated with the symbol. For example, if symbols are associated with binary values, the set of admissible values may correspond to logical zero ("0") and logical one ("1"). In this example a signal containing hard information would associate each symbol contained in the signal with either a logical zero or a logical one.

In converting the retrieved signal of the storage device to hard information, some information is lost, because the stored information must be associated with one of the predefined admissible values. For example, when processing binary information, stored symbols must be associated with either a logical zero or a logical one. Therefore, based on hard information alone, it is not possible to determine the likelihood that a given symbol of the retrieved signal indeed corresponds to the admissible value assigned to that symbol. For example, when processing binary information, hard information does not convey whether a given symbol of the retrieved signal was a "strong" or a "weak" logical zero or logical one. In other words, information about the uncertainty introduced by associating a given symbol with a logical zero or a logical one is not part of the hard information.

Soft information, in contrast to hard information, generally includes a likelihood metric that conveys the likelihood that a given one of the predefined admissible values gave rise to the stored symbol. Likelihood values for several or all of the admissible values may be included. For example, assuming a binary coding scheme, soft information may include two likelihood metrics: one that provides the likelihood that the given symbol corresponds to a logical zero and one that provides the likelihood that the given symbol corresponds to a logical one. For the binary case, one of these likelihoods may be omitted because it can be derived from the other. In contrast to hard information, soft information is able to capture whether a given symbol is a "weak" or a "strong" logical zero or logical one. Accordingly, the decoder is provided with additional information that may be used to improve decoding performance.

In spite of the potential to improve decoding performance, soft information may lead to additional complexity in practical implementations. In practical implementations, the likelihood metrics associated with each of the predefined admissible values may need to be quantized to a finite number of quantization levels. Representing soft information may therefore be significantly more complex compared to hard information. It is therefore important to find efficient ways of representing soft information such that the benefits of improved decoding performance outweigh the additional complexity in practical implementations.

SUMMARY OF THE DISCLOSURE

In accordance with an embodiment of the present disclosure, a method is provided for generating a soft information metric corresponding to a bit stored in a memory. The method may include comparing a symbol value associated with the stored bit to a plurality of decision thresholds to obtain a plurality of binary values. Further, one of the plurality of binary values may be selected to obtain a reference value, and a frequency metric may be computed, which corresponds to the number of times each of the plurality of binary values equals a predefined value. The soft information metric may then be determined based on the frequency metric and the reference value.

In some implementations, the stored bit may be part of a sequence of stored bits, and the method may further include determining a decision threshold of the plurality of decision thresholds based on a position of the stored bit in the sequence of stored bits.

In some implementations, the soft information metric is a log-likelihood ratio (LLR) metric.

In some implementations, determining the soft information metric may further include determining an index value based on the frequency metric and the reference value and identifying the soft information metric in a lookup table based on the index value.

In some implementations, the number of decision thresholds in the plurality of decision thresholds may be determined based on a desired quantization level associated with the soft information metric.

In some implementations, the number of decision thresholds in the plurality of decision thresholds may be increased in response to determining that a previous decoding attempt has failed.

In some implementations, the method may further include generating an index value based on the frequency metric and the reference value and storing a histogram of at least one of the index value, the frequency metric, and the reference value to obtain statistics of the soft information metric.

In accordance with another embodiment of the present disclosure, a system is provided for generating a soft information metric corresponding to a bit stored in a memory. The system may include a demodulator configured to compare a symbol value associated with the stored bit to a plurality of decision thresholds to obtain a plurality of binary values. The system may further include control circuitry configured to select one of the plurality of binary values to obtain a reference value, compute a frequency metric corresponding to a number of times each of the plurality of binary values equals a predefined value, and determine the soft information metric based on the frequency metric and the reference value.

In some implementations, the stored bit may be part of a sequence of stored bits and the demodulator may be further configured to determine a decision threshold of the plurality of decision thresholds based on a position of the stored bit in the sequence of stored bits.

In some implementations, the soft information metric may be a log-likelihood ratio (LLR) metric.

In some implementations, the control circuitry may be further configured to determine an index value based on the frequency metric and the reference value and identify the soft information metric in a lookup table based on the index value.

In some implementations, the demodulator may be further configured to determine the number of decision thresholds in the plurality of decision thresholds based on a desired quantization level associated with the soft information metric.

In some implementations, the demodulator may be further configured to increase the number of decision thresholds in the plurality of decision thresholds in response to determining that a previous decoding attempt has failed.

In some implementations, the control circuitry may be further configured to generate an index value based on the frequency metric and the reference value and store a histogram of at least one of the index value, the frequency metric, and the reference value to obtain statistics of the soft information metric.

In another embodiment of the present disclosure, a system is provided for generating a soft information metric. The system may include a buffer register configured to buffer a plurality of bit values retrieved from a data storage device, a comparator configured to compare the plurality of bit values buffered in the buffer register to a reference value to obtain a plurality of comparison values, and an accumulation register that stores a frequency metric, wherein the frequency metric is incremented based on the plurality of comparison values.

BRIEF DESCRIPTION OF THE DRAWINGS

Further features of the disclosure, its nature, and various advantages, will be apparent upon consideration of the following detailed description, taken in conjunction with the accompanying drawings, in which:

FIG. 3 shows illustrative mapping tables for encoding decision regions based on a frequency metric and a reference value, in accordance with some embodiments of the present disclosure;

DETAILED DESCRIPTION

The present disclosure generally relates to a hardware architecture for generating soft information in a data storage system. In one aspect, the soft information may be encoded efficiently by utilizing a frequency metric and a reference value.

Figure 1:
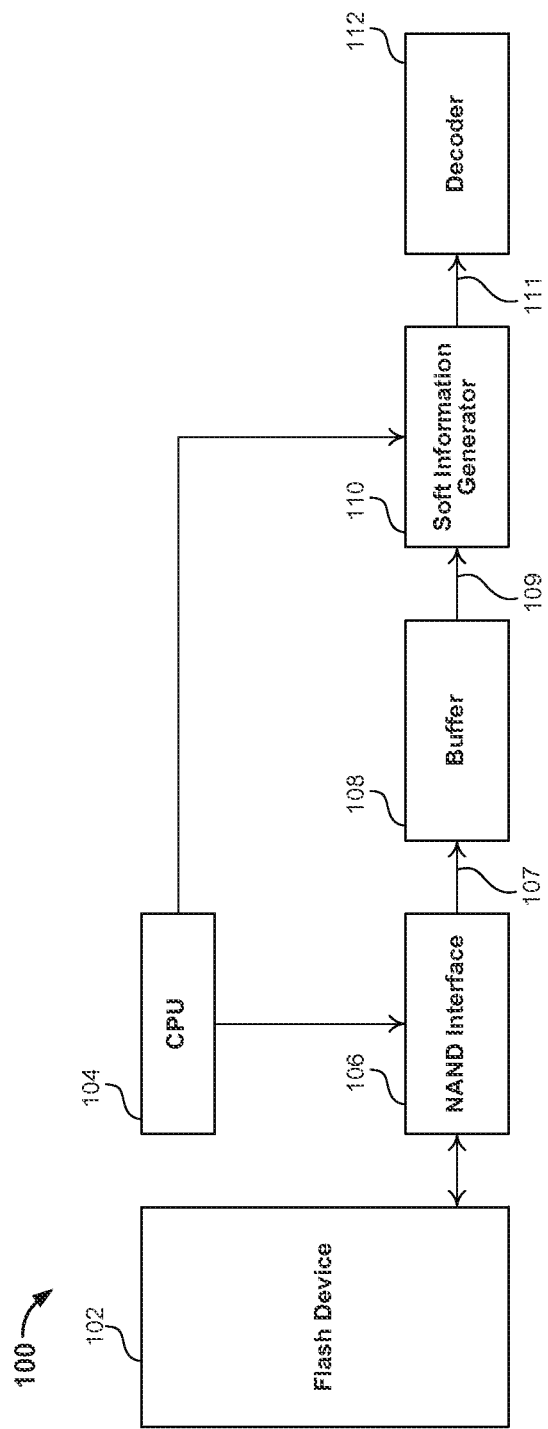
FIG. 1 shows an illustrative diagram of a data storage system that utilizes soft information to improve decoding reliability, in accordance with some embodiments of the present disclosure.

FIG. 1 shows an illustrative block diagram of a data storage system 100 that utilizes soft information to improve decoding reliability, in accordance with some embodiments of the present disclosure. Block diagram 100 includes flash device 102, soft information generator 110, and decoder 112. Soft information generator 110 may be connected to flash device 102 through NAND interface 106 and buffer 108. Soft information generator 110 and NAND interface 106 may be connected to central processing unit (CPU) 104, which may coordinate their respective operation.

NAND interface 106 may coordinate write operations to and read operations from flash device 102. In some implementations, NAND interface 106 may read from flash device 102 by applying a certain read reference voltage and processing the resulting signal retrieved from flash device 102. Multiple read operations (for example, 15 read operations) may be performed with respect to the same stored symbol, and each read operation may be associated with a different read reference voltage. A symbol may refer to a physical signal, stored or transmitted, that represents an integer number of bits. For example, in some embodiments of the present disclosure, a symbol may refer to the amount of charge that is stored in a cell (e.g., in a transistor) of flash device 102. Data signal 107, the output signal of NAND interface 106, may include binary values (i.e., either logical zeroes or logical ones) associated with each of the one or more read operations performed by NAND interface 106. The binary information may represent hard information associated with each of the read operations. However, because multiple versions of hard information are available, each of which corresponds to a different value of the read reference voltage, soft information may be generated based on the retrieved signals.

Buffer 108 takes data signal 107 as input and buffers the retrieved data associated with different read operations. In some implementations, the buffering of data signal 107 may facilitate the generation of soft information by soft information generator 110. In other implementations, such buffering may not be necessary and consequently buffer 108 may be omitted without departing from the scope of the present disclosure.

Soft information generator 110 may be connected to buffer 108 and may take buffered data signal 109 as input. For each symbol stored in flash device 102, buffered data signal 109 may include a predefined number of binary values, each of which corresponds to a separate read operation with a different read reference voltage. For example, 15 binary values may be retrieved by NAND interface 106 for each symbol stored in flash device 102, and each of the 15 binary values may be associated with a different read reference voltage. Of course, a smaller or larger number of binary values may be used without departing from the scope of the present disclosure. Soft information generator 110 processes buffered data signal 109 to obtain a more compact representation of the retrieved data. For example, in some embodiments, soft information generator 110 may generate a frequency metric and a reference value to represent the binary data associated with each symbol. In some implementations, the frequency metric may denote the number of logical zeroes or logical ones that occur in the binary data of a given symbol. The reference value may correspond to the binary value associated with a specific one of the read reference voltage levels. For example, if a sequence of 15 binary values is associated with a given symbol, the binary value associated with the last entry in the sequence may be used as the reference value.

Any combination of the frequency metric and the reference value may be associated with a specific soft information metric. For example, if the frequency metric indicates that a majority of entries in the sequence are associated with a logical zero, this may serve as an indication that there is a high likelihood that the retrieved symbol indeed corresponds to a logical zero. On the other hand, if the frequency metric indicates that a similar number of logical zeroes and logical ones is present, this may serve as an indication that the likelihood of the retrieved symbol having been caused by a logical zero or a logical one is approximately equal. In some embodiments, soft information may be generated based on both the frequency value and the reference value. The above example serves only as an illustration of how soft information may be generated. The generation of soft information based on a frequency metric and a reference value may be performed in other ways, without departing from the scope of the present disclosure, as is discussed in the following.

The frequency metric and the reference value may be used together to generate a soft information metric. In some implementations, the frequency metric and the reference value may represent indices that are used to look up a specific soft information value in a lookup table. However, other representations of buffered data signal 109, or buffered data signal 109 itself, may be used to obtain the soft information. The output of soft information generator 110 may be soft information signal 111. CPU 104 may control the generation of soft information signal 111 by providing the lookup tables used as part of the generation process. CPU 104 may also control the granularity of the soft information to be generated. For example, in normal operation, soft information may be quantized coarsely or omitted entirely. However, if decoder 112 fails to decode the data based on the coarse information, additional data may be retrieved and represented as soft information with a higher degree of accuracy.

Decoder 112 may perform decoding of the data signal retrieved from flash memory 102 based on soft information signal 111. In some implementations, decoder 112 may be a low density parity check (LDPC) decoder, although other decoder types may also be used. Decoder 112 may represent the soft information used for decoding in different ways, such as by associating a log-likelihood ratio (LLR) with each member of the set of admissible symbol values.

Figure 2:
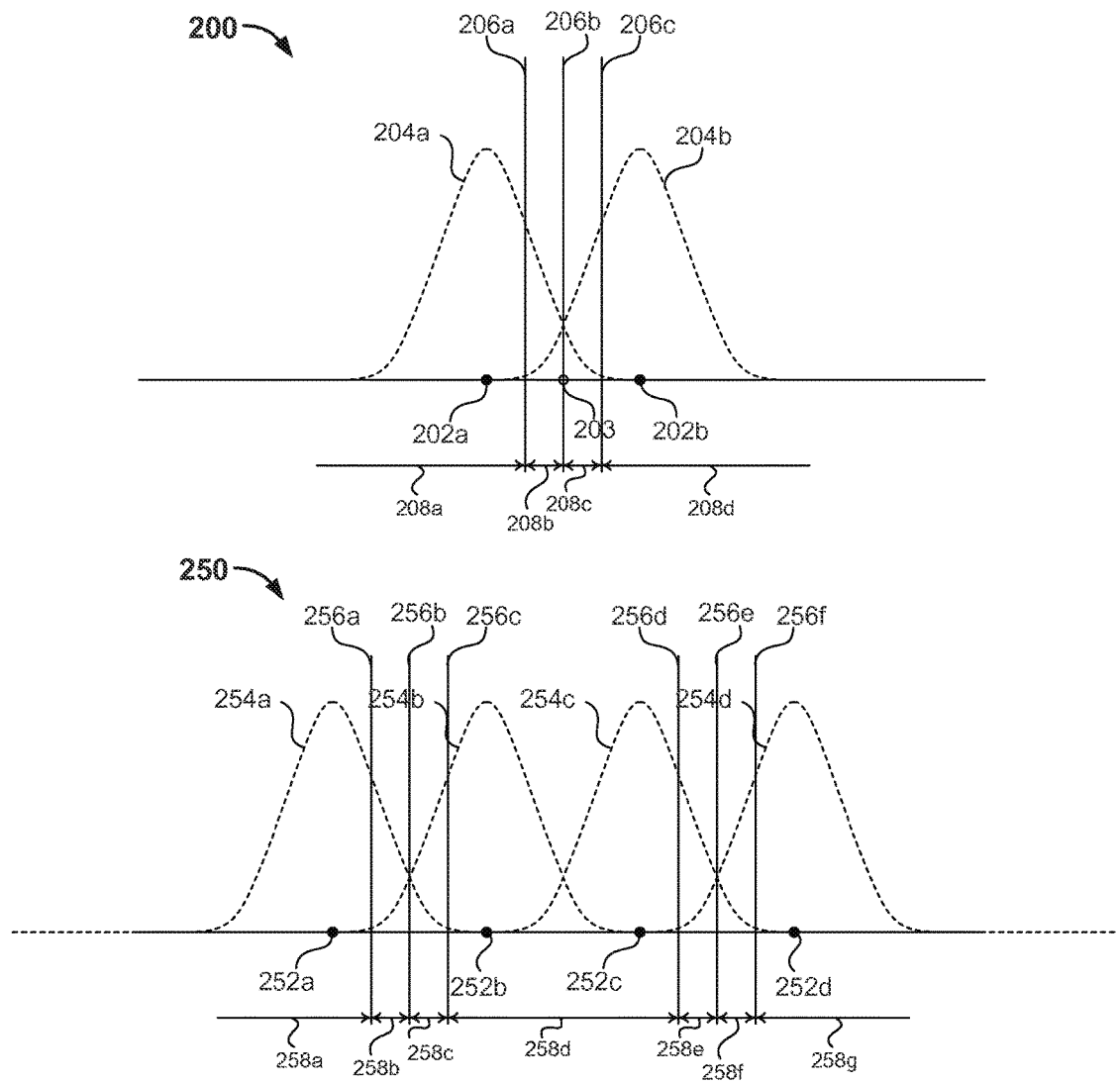
FIG. 2 shows illustrative diagrams of decision regions associated with storage systems that use 1-bit per cell and 2-bit per cell modulation schemes, in accordance with some embodiments of the present disclosure.

FIG. 2 shows illustrative diagrams of decision regions associated with storage systems that use 1-bit per cell and 2-bit per cell modulation schemes, in accordance with some embodiments of the present disclosure. Diagram 200 may correspond to a 1-bit per cell storage system in which each symbol stored on flash device 102 encodes a single bit. Accordingly, in the absence of corruption of the data during storage or retrieval, the stored symbols may correspond to any one of two values. These two admissible values are represented by signal constellation points 202a and 202b (generally signal constellation points 202). In some implementations, pulse amplitude modulation (PAM) may be used as the modulation scheme, which encodes information in the amplitude of the signal. For example, signal constellation point 202a may correspond to a first amplitude value and signal constellation point 202b may correspond to a second amplitude value. When corruption of the signal is present, the actual charge level or symbol value may deviate from signal constellation points 202. In many systems, such corruption may be approximated by normal distributions 204a and 204b (generally normal distribution 204) with zero-mean and a certain variance. The corruption to the signal is generally additive. Therefore, if a certain stored symbol corresponds to signal constellation point 202a, the symbol value after corruption has been taken into account may be given by normal distribution 204a. Normal distribution 204a may denote the probability density function under the hypothesis that the stored bit is associated with signal constellation point 202a and it is therefore centered at the amplitude value corresponding to signal constellation point 202a (in accordance with the assumption that the corruption has zero-mean). Similarly, if the stored symbol is associated with signal constellation point 202b, the corruption would lead to conditional probability density function 204b, which is centered at the amplitude value corresponding to signal constellation point 202b.

The symbol values subject to corruption may need to be converted to hard information by NAND interface 106 prior to being used by decoder 112. The conversion may be performed by comparing the corrupted symbol value to a decision threshold, such as decision threshold 206b. If the retrieved symbol value lies above (or to the right of) decision threshold 206b, then a logical zero may be recorded (assuming that signal constellation point 202b corresponds to a logical zero) and if the retrieved symbol value lies below (or to the left of) decision threshold 206b then a logical one may be recorded (assuming that signal constellation point 202a denotes a logical one). Decision threshold 206b may be selected such that it lies at the center between signal constellation points 202a and 202b. At this center point the conditional probability density functions 204a and 204b intersect or, in other words, if a symbol value above center point 203 is observed, it is more likely that this symbol corresponds to signal constellation point 202b and vice versa.

As is discussed in relation to FIG. 1, the location of decision threshold 206b may be adjusted by applying a different read reference voltage, and multiple instances of hard information may be obtained for different decision thresholds. For example, decision thresholds 206a and 206c may be used in addition to decision threshold 206b. The symbol value may be compared separately with decision thresholds 206a, 206b, and 206c (generally decision thresholds 206) to obtain a sequence of three binary values. Together these three binary values may indicate one of four decision regions in which the symbol value must lie. In particular, these decision regions may be given by: (1) first decision region 208a corresponds to symbol values below threshold 206a; (2) second decision region 208b corresponds to symbol values between decision threshold 206a and 206b; (3) third decision region 208c corresponds to symbol values between decision threshold 206b and 206c; and (4) fourth decision region 208d corresponds to symbol values above decision threshold 206c. The sequence of binary values, or equivalently their associated decision regions, may be converted to a soft information metric because they provide a likelihood that the symbol value corresponds to a logical zero or a logical one. For example, if a symbol value lies in first decision region 208a, it is more likely that this symbol value is associated with a logical one than if the symbol value were associated with second decision region 208b, although both first and second decision regions would be mapped to a logical one if a hard decision based on decision threshold 206b were made. In other words, if a symbol value falls into first decision region 208a, it may be viewed as a "strong" logical one, whereas if it falls into second decision region 208b, it may be viewed as a "weak" logical one. Similarly, if a symbol value falls into third decision region 208c, it may be viewed as a weak logical zero, and if it falls into fourth decision region 208d it may be viewed as a strong logical zero.

Diagram 200 illustrates the generation of soft information based on multiple decision thresholds for a modulation scheme that associates each data symbol with a single bit. For example, this may be representative of a flash memory that stores one bit per memory cell. However, multiple decision thresholds may also be used with modulation schemes that associate multiple bits with each data symbol. For example, this may be representative of a flash memory that stores two, three, or more bits per memory cell. Diagram 250 illustrates a modulation scheme in which two bits are stored per memory cell. Diagram 250 encodes the two bits based on four signal constellation points 252a, 252b, 252c, and 252d (generally, signal constellation points 252). For example, signal constellation point 252a may represent bit combination "11" (i.e., a sequence of two logical ones), signal constellation point 252b may represent bit combination "10," signal constellation point 252c may represent bit combination "00," and signal constellation point 252d may represent bit combination "01." In some implementations, the first of the pair of bits may be referred to as the most significant bit (MSB) and the second bit may be referred to as the least significant bit (LSB).

When decoding the LSB, decision thresholds 256a-f (generally decision thresholds 256) may be placed around the center point of signal constellation points 252a and 252b and the center point of signal constellation points 252c and 252d, respectively. Placing decision thresholds at the center point between signal constellation points 252b and 252c may not be required because the LSB assigned to the bit sequences associated with signal constellation points 252b and 252c is both equal to logical zero. Similar to diagram 200, decision thresholds 256 partition diagram 250 into a number of decision regions. In particular, diagram 250 is associated with six decision regions: (1) first decision region 258a is associated with symbol values below decision threshold 256a; (2) second decision region 258b is associated with symbol values between decision thresholds 256a and 256b; (3) third decision region 258c is associated with symbol values between decision thresholds 256b and 256c; (4) fourth decision region 258d is associated with symbol values between decision thresholds 256c and 256d; (5) fifth decision region 258e is associated with symbol values between decision thresholds 256d and 256e; (6) sixth decision region 258f is associated with symbol values between decision thresholds 256e and 256f; and (7) seventh decision region 258g is associated with symbols values above decision threshold 256f. Similar to diagram 200, each of the decision regions may be associated with a degree of likelihood that the LSB is either a logical zero or a logical one. For example, first decision region 258a and seventh decision region 258g may be associated with a strong logical one; second decision region 258b and sixth decision region 258f may be associated with a weak logical one; third decision region 258c and fifth decision region 258e may be associated with a weak logical zero and the fourth decision region 258d may be associated with a strong logical zero.

FIG. 3 shows illustrative mapping tables for encoding decision regions based on a frequency metric and a reference value, in accordance with some embodiments of the present disclosure. Table 300 shows an example encoding scheme for the decision regions shown in diagram 200, as discussed in relation to FIG. 2. Decision region 302a may correspond to first decision region 208a, decision region 302b may correspond to second decision region 208b, decision region 302c may correspond to third decision region 208c, and decision region 302d may correspond to fourth decision region 208d. Each of decision regions 302a-302d (generally decision regions 302) may be associated with a sequence of bits that is represented by a column in table 300. The entries of each sequence of bits correspond to the binary value that is associated with one of the decision thresholds. For example, for region 302a, the first entry in the sequence is associated with decision threshold 206a, the second entry in the sequence is associated with decision threshold 206b, and the third entry is associated with decision threshold 206c. The entry corresponding to a decision threshold indicates whether the decision region lies to the left or to the right of the decision threshold, i.e., whether symbol values in that decision region are smaller or larger than the decision threshold. For example, with reference to the first column of table 300, the first entry in the sequence (corresponding to threshold 304a) is equal to logical one, because decision region 302a is to the left of decision threshold 206a. Similarly, the second entry of the sequence (corresponding to threshold 304b) is logical one because decision region 302a also lies to the left of decision threshold 206b. Finally, the third entry of the sequence (corresponding to threshold 304c) is equal to logical one because decision region 302a is to the left of decision threshold 206c.

For a specific symbol value, soft information may be generated by determining in which of the decision regions the symbol value falls. For example, with reference to diagram 200, if a specific symbol value is located between thresholds 206a and 206b, it would fall into second decision region 208b. Accordingly, it would be assigned the bit sequence associated with second decision region 302b in table 300.

In some embodiments, the sequence of bits may be used directly by decoder 112 or it may be used by soft information generator 110 to generate soft information. In some implementations, the sequence of bits may be compressed and represented by a frequency metric and a reference value, respectively. In particular, the bit sequences associated with decision regions 302 may have the property that, unless all of their entries are either logical zero or logical one, there is only a single transition point between a sequence of logical ones and a sequence of logical zeroes. Accordingly, to reconstruct the sequence, it may suffice to know the number of logical zeroes (or equivalently the number of logical ones) as well as the location of a reference value, such as the binary value associated with the rightmost decision threshold. For the example shown in table 300, frequency metric 306 may be zero for the first decision region (no zero entries are part of the sequence), one for the second decisions region (a single zero is present), two for the third decision region (two zero entries are present), and three for the fourth decision region (all three entries of the sequence are zero). Reference value 308 may be equal to the last sequence entry of each decision sequence. For the specific example in table 300, the reference value may not be needed to reconstruct the bit sequence of each decision threshold, but it may be required in other implementations as is shown below.

Table 350 shows an example encoding scheme for the decision regions shown in diagram 250, as is discussed in relation to FIG. 2. Decision region 352a may correspond to first decision region 258a, decision region 352b may correspond to second decision region 258b, decision region 352c may correspond to third decision region 258c, decision region 352d may correspond to fourth decision region 258d, decision region 352e may correspond to fifth decision region 258e, decision region 352f may correspond to sixth decision region 258f, and decision region 352g may correspond to seventh decision region 258g. Each of decision regions 352a-352g (generally decision regions 352) may be associated with a sequence of bits that is represented by a column in table 350. The entries of each sequence of bits correspond to the binary value that is associated with one of the decision thresholds. In diagram 350, decision thresholds 258 may be partitioned into three groups. For example, decision threshold 256a may be grouped with decision threshold 256d, decision threshold 256b may be grouped with decision threshold 256e, and decision threshold 256c may be grouped with decision threshold 256f. In table 350, row 354b may refer to the first group of decision thresholds, row 354a may refer to the second group of decision thresholds, and row 354c may refer to the third group of decision thresholds. Each row in table 350 (i.e., each entry in the bit sequences belong to a particular decision region) may indicate whether the decision region is located within the interval defined by the two decision thresholds belonging to a group of decision thresholds. For example, row 354b denotes whether the decision region lies outside of the interval defined by decision thresholds 256b and 256e (in which case a logical one is assigned in row 354b), or if the decision region lies within the interval defined by decision thresholds 256b and 256e (in which case a logical zero is assigned in row 354b). Similarly, row 354a denotes whether the decision region lies outside of the interval defined by decision thresholds 256a and 256d (in which case a logical one is assigned), or if the decision region lies within the interval defined by decision thresholds 256a and 256d (in which case a logical zero is assigned). Similar to table 300, the bit sequences defined in table 350 may be used directly by decoder 112, or they may be used by soft information generator 110 to generate soft information, such as an LLR. In some implementations, the bit sequences may be compressed and represented by a frequency metric and a reference value, respectively. The frequency metric may correspond to the number of logical zeroes (or alternatively, the number of logical ones) that are contained in the bit sequence. The reference value may correspond to the bit value corresponding to a predefined one of the decision thresholds 354.

Figure 4:
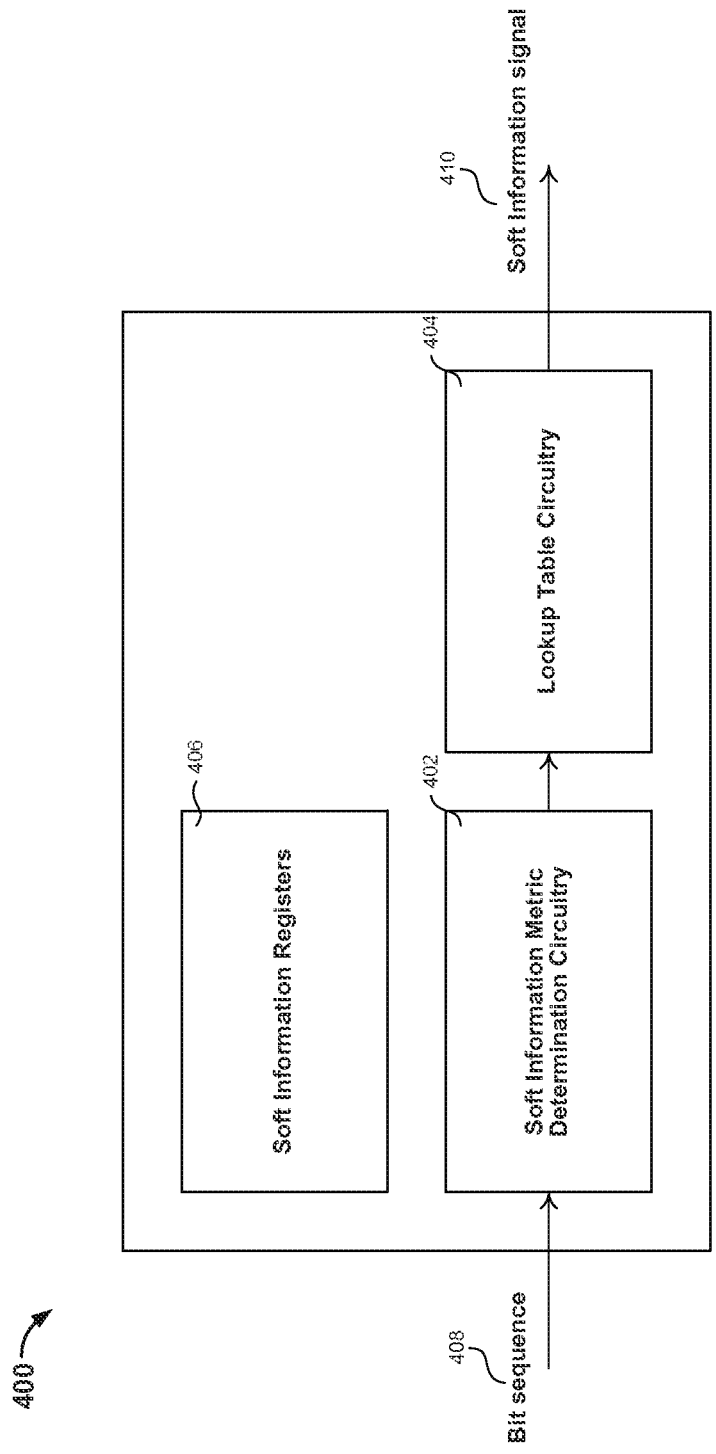
FIG. 4 shows a block diagram of hardware architecture 400 for generating soft information in a data storage system, in accordance with some embodiments of the present disclosure.

FIG. 4 shows a block diagram of hardware architecture 400 for generating soft information in a data storage system, in accordance with some embodiments of the present disclosure. Hardware architecture 400 may include soft information metric determination circuitry 402, lookup table circuitry 404, and soft information registers 406. Soft information metric determination circuitry 402 may receive the bit sequences of diagram 300 and 350 as input. As is discussed in relation to FIG. 2 and FIG. 3, each bit sequence may be associated with the value of a retrieved data symbol and may reflect the location of the data symbol with respect to several decision thresholds. Soft information metric determination circuitry 402 may determine a more compact representation of bit sequence 408, for example by representing bit sequence 408 based on a frequency metric and a reference value. The determination of the frequency metric may be performed by counting the number of logical zeroes contained in bit sequence 408. The reference value may be obtained by using the binary value associated with a predefined entry of the sequence as a reference value.

Lookup table circuitry 404 may receive the frequency metric and the reference value as input. Together the frequency metric and the reference value may be used to uniquely identify a soft information metric in a lookup table. For example, frequency metric and reference value may be converted to a single index that is in turn used to identify a specific entry in a lookup table. The soft information metric stored in the lookup table may then be output as soft information signal 410 and provided to decoder 112.

Soft information registers 406 may include programmable registers to program or modify lookup tables accessed by lookup table circuitry 404 (not shown). Soft information registers 406 may also contain instructions on a desired quantization accuracy. For example, for initial processing of a symbol, low-accuracy soft information (or possibly even hard information) may be used, because it is faster or less computationally demanding. If decoder 112 is able to successfully perform decoding based on the low-accuracy information, then further processing may not be required. However, if decoding based on the low-accuracy information fails, then information with a higher degree of accuracy may be computed.

Figure 5:
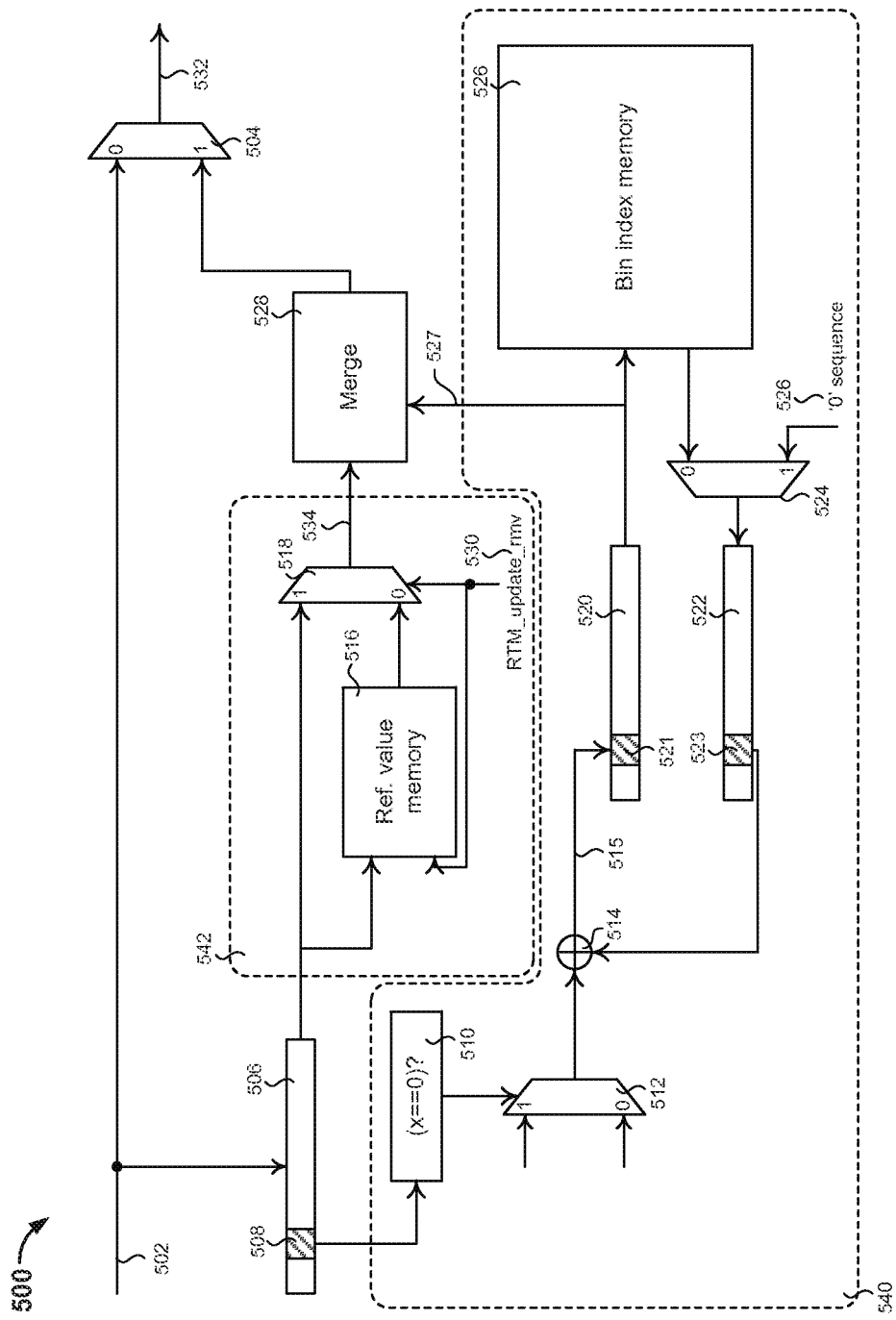
FIG. 5 shows a block diagram of soft information metric determination circuitry, in accordance with some embodiments of the present disclosure.

FIG. 5 shows a block diagram of soft information metric determination circuitry 500, in accordance with some embodiments of the present disclosure. Soft information determination circuitry 500 may consist of frequency metric accumulation circuitry 540 and reference value determination circuitry 542. Frequency metric accumulation circuitry 540 and reference value determination circuitry 542 may concurrently process binary data 502 received as input. The output of frequency metric accumulation circuitry 540 and the output of reference value determination circuitry 542 may be merged by combiner 528 and provided as output signal 532. In some embodiments, frequency metric accumulation circuitry 540 and reference value determination circuitry 542 may be used only when in retry mode, e.g., when a previous decoding attempt based on hard information or soft information with lower granularity has failed. In particular, when retry mode is inactive, binary data 502 may not be processed but simply passed through to multiplexer 504 which outputs binary data 502 as output signal 532 without further processing. In this case, no soft information may be generated. Alternatively, if retry mode is active, processing by frequency metric accumulation circuitry 540 and reference value determination circuitry 542 is performed.

Frequency metric accumulation circuitry 540 includes comparator 510, multiplexers 512 and 524, adder 514, accumulation register 520, reference register 522, and bin index memory 526. Frequency metric accumulation circuitry 540 may interface with buffer register 506 that temporarily buffers binary data 502 for processing. For example, in some implementations, buffer register 506 may have a width of 8 bits and may therefore be able to accommodate 1 byte of data. Frequency metric accumulation circuitry 540 may process data in buffer register 506 on a per bit basis, i.e., at a given time it may process a specific bit position 508. After completing processing for specific bit position 508, it may process the next bit position until all bits in buffer register 506 have been processed. Although not shown, other implementations, may be considered without departing from the scope of the present disclosure, such as processing bits in buffer register 508 concurrently using multiple hardware units each with separate frequency metric accumulation circuitry 540.

Frequency metric accumulation circuitry 540 may process bit position 508 of buffer register 506 by comparing the bit to a reference value using comparator 510. For example, in some implementations a reference value of logical zero may be used. A value of logical one (not shown) may also be used as the reference value in some implementations. The output signal of comparator 510 is logical one if the bit stored in bit position 508 is equal to the reference value; otherwise it is equal to logical zero. Multiplexer 512 may receive the output signal of comparator 510 and output logical one if the output signal is equal to logical one and may output logical zero otherwise. The output signal of multiplexer 512 may then be added to a previously accumulated value 523 corresponding to the same bit position. Previously accumulated value 523 may be stored in accumulation register 522. The result of the addition performed by adder 514 may be stored in accumulation register 520 at the corresponding bit position. In some implementations, accumulation registers 520 and 522 may have a larger bit width than buffer register 506, because accumulated value 515 after addition may have a value that is greater than one and therefore cannot be expressed using a single bit. For example, if accumulation value 515 can range from 0 to 15 (e.g., corresponding to 15 read operations), then four bits may be required in accumulation registers 520 and 522 for each bit position. Accordingly, in this example, the bit width of accumulation registers 520 and 522 would be 32 bits. Of course, other bit widths may be considered without departing from the scope of the present disclosure.

Accumulation register 520 and register 522 may be connected to bin index memory 526. Registers 520 and 522 may be implemented to facilitate the read-modify-write function for bin index memory 526. Bin index memory 526 may be used to store the accumulated frequency metric of binary input data 502. The width of bin index memory may therefore be equal to the width of accumulation registers 520 and 522. The depth of the bin index memory 526 may depend on the size of a portion of binary input data 502 that is to be processed concurrently. For example, in some implementations, the depth of bin index memory 526 may be designed such that a codeword can be processed concurrently. Accordingly, the depth of bin index memory 526 may be determined by choosing it to be equal to the number of bytes in a codeword.

Frequency metric accumulation circuitry 540 may sequentially process the bit positions of buffer register 506 to obtain updated accumulated values stored in accumulation register 520. Once the last bit position in buffer register 506 has been processed, the values contained in accumulation register 520 may be stored at a specific memory location in bin index memory 526. For example, a row in bin index memory 526 may be overwritten with the values of accumulation register 520. Subsequently, binary data corresponding to a new read operation may be received by buffer register 506 and processing may resume with the first bit position of buffer register 506. When receiving binary input data 502 associated with a new read operation of flash memory 102, previously accumulated values may be retrieved from bin index memory 526 and stored in accumulation register 522. The values transferred into accumulation register 522 are thus available for the previously-described addition by adder 514.

Once all read operations for a specific memory location have been completed, the frequency metric accumulated by frequency metric accumulation circuitry 540 may be combined with a reference value by combiner 528 and output as output signal 532. At the same time, accumulation register 522 may be reset by filling accumulation register 522 with logical zeroes using zero sequence 526 and multiplexer 526. Multiplexer 524 may provide the zero sequence when a certain reference signal is set. For example, this reference signal may be denoted "RTM_first_page."

Reference value determination circuitry 542 receives binary data stored in buffer register 506 as input. As is described in relation to FIG. 3, the reference value reflects the value associated with a specific read operation of flash memory 102 (or equivalently with a specific decision threshold 206 or 256). Accordingly, reference value determination circuitry 542 may not perform any processing unless the read operation corresponding to the reference value is reached. In some implementations, reference signal 530 may indicate whether the current read operation corresponds to the reference value (this signal may also be denoted as "RTM_update_rmv"). If reference signal 530 is active, the binary values of buffer register 506 are output and merged by combiner 528 with the frequency metric signal 527. At the same time, reference signal 530 may also trigger reference value memory 516 to store the binary data contained in buffer register 506. Alternatively, if reference signal 530 is inactive, no output signal may be provided and the data contained in buffer memory 506 may not be processed by reference value determination circuitry 542.

Reference value output signal 534, determined by reference value determination circuitry 540, and frequency metric output signal 536, determined by frequency metric accumulation circuitry 542, may be merged by combiner 528. In some implementations, the combining performed by combiner 528 may simply concatenate the bits contained in frequency metric output signal 536 and reference value output signal 534. For example, if frequency metric output signal 536 uses 4 bits to express the accumulated frequency metric per bit position, and if one bit is used to express the reference value for each bit position, then after combining a total of 5 bits may be used per bit position. Accordingly, combiner 528 may simply increase the bit width of the output signal. Alternatively, combiner 528 may merge the information contained in frequency metric output signal 536 and reference value output signal 534 by encoding it in a more compact form, for example by using some form of joint encoding. After combining, the output signal of combiner 528 may be output by multiplexer 504 as output signal 532.

Figure 6:
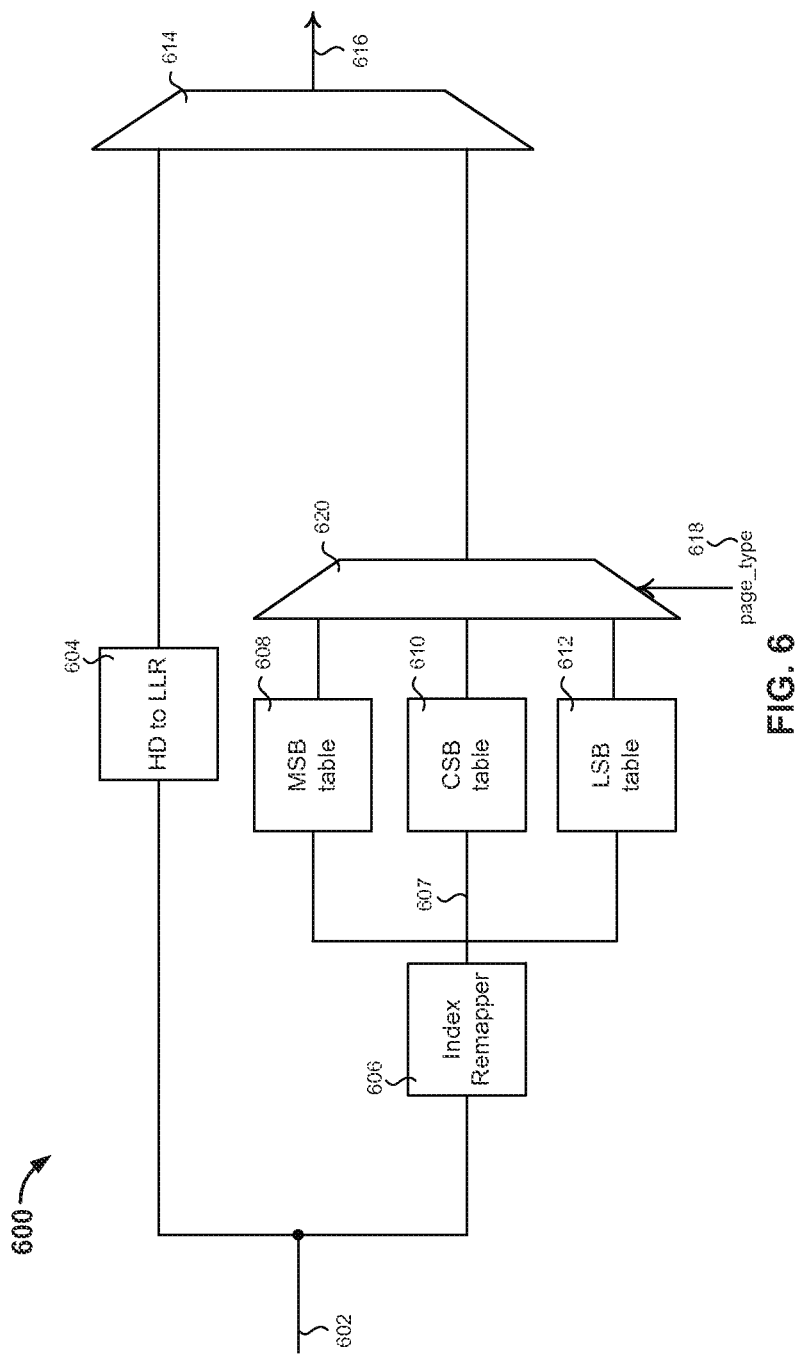
FIG. 6 shows an illustrative example of lookup table circuitry, in accordance with some embodiments of the present disclosure.

FIG. 6 shows an illustrative example of lookup table circuitry 600, in accordance with some embodiments of the present disclosure. Lookup table circuitry 600 receives input signal 602 that includes a frequency metric and a reference value when retry mode is enabled. For example, input signal 602 may correspond to output signal 532 in FIG. 5. When retry mode is not enabled, frequency metric and reference value need not be included. Instead, as is described in relation to FIG. 5, output signal may simply correspond to binary input sequence 502. Lookup table circuitry 600 may perform different types of processing depending on the type of input signal 602, i.e., depending on whether frequency metric and reference value are included. If retry mode is disabled (and accordingly frequency metric and reference value are not present), the binary values of input signal 602 may simply be mapped to two log-likelihood ratios, one corresponding to logical zero and one to logical one. The mapping may be performed by HD-to-LLR mapper 602, which maps hard decisions (HDs) to LLRs. The output signal of HD-to-LLR mapper 602 may be output by multiplexer 614 as output signal 616.

When retry mode is enabled, input signal 602 includes a frequency metric and a reference value for each input bit. For each bit, index remapper 606 may convert the frequency metric and the reference value to a single index 607. For example, in some implementations the bits representing the frequency metric and the bit representing the reference value may simply be concatenated in a predefined order. The resulting bit sequence may then be interpreted as an integer number to obtain index value 607. Alternatively, other types of mappings may be considered for associating an index with the combination of frequency metric and reference value, without departing from the scope of the present disclosure. Index value 607 is used to identity an element in at least one of LSB table 612, CSB table 610, and MSB table 608. LSB table 612 may denote a table associated with the least significant bit of a symbol representing multiple bits, CSB table 610 may denote a table associated with the center significant bit of a symbol representing multiple bits, and MSB table may denote a table associated with the most significant bit of a symbol representing multiple bits. MSB table 608, CSB table 610, and LSB table 612 may generate respective output signals that are received by multiplexer 620. Multiplexer 620 may further receive a control signal 618 that indicates which one of the output signals of MSB table 608, CSB table 610, and LSB table 612 should be used. In some implementations, control signal 618 may also be referred to as "page_type." The output signal of multiplexer 620 is received by multiplexer 614 and output as output signal 616 when retry mode is active. In some implementations, rather than generating a respective output signal for MSB table 608, CSB table 610, and LSB table 612, only a single output signal for the lookup table indicated by control signal 618 may be performed. This may save computational resources without impacting the output of lookup table circuitry 600, because control signal 618 anyway only selects a single output signal of one of the lookup tables.

In some embodiments, bin index memory 526 and reference value memory 516 may store the frequency metrics and the reference values for a number of read operations. The stored frequency metrics and reference values may be retrieved at predetermined times, and histograms may be generated based on the stored frequency metrics and reference values. In some embodiments histogram data may be stored in multiple histogram memory units. For example, eight histogram memory units may be included in soft information generator 110, one such unit for each bit in buffer register 506, i.e., for each bit in a byte of data. Histogram data may be stored in the histogram memory units by converting frequency metrics and reference values to a single index, for example by using index remapper 606. The resulting index may be used to define a specific memory location. Every time a certain index occurs, the memory location associated with that index may be accessed and the stored value retrieved. Next, this stored value may be incremented by one to account for the current occurrence of the index value, and the incremented value may be written back to the memory location. Accordingly, histogram memory units may count the number of times that a certain bit location in buffer register 506 is equal to a certain index value. In other embodiments, instead of using separate histogram memory units for each bit location in buffer register 506, a single histogram memory unit may be used. If only a single histogram memory unit is available, it may not be feasible to store histogram data for all bit locations simultaneously, because the histogram memory unit may need to be accessed approximately eight times more frequently compared to the case in which eight dedicated histogram memory units are used. In some implementations, this issue may be avoided by storing only histogram data associated with a subset of the bit locations in buffer register 506. Alternatively, or additionally, histogram data may not be stored in real-time but buffered in bin index memory 526 and reference value memory 516. At predefined times, the data stored in these memories may be retrieved and stored in a histogram memory unit. For example, these predefined times may correspond to time periods when the system operates in non-retry mode and therefore need not generate soft information.

Figure 7:
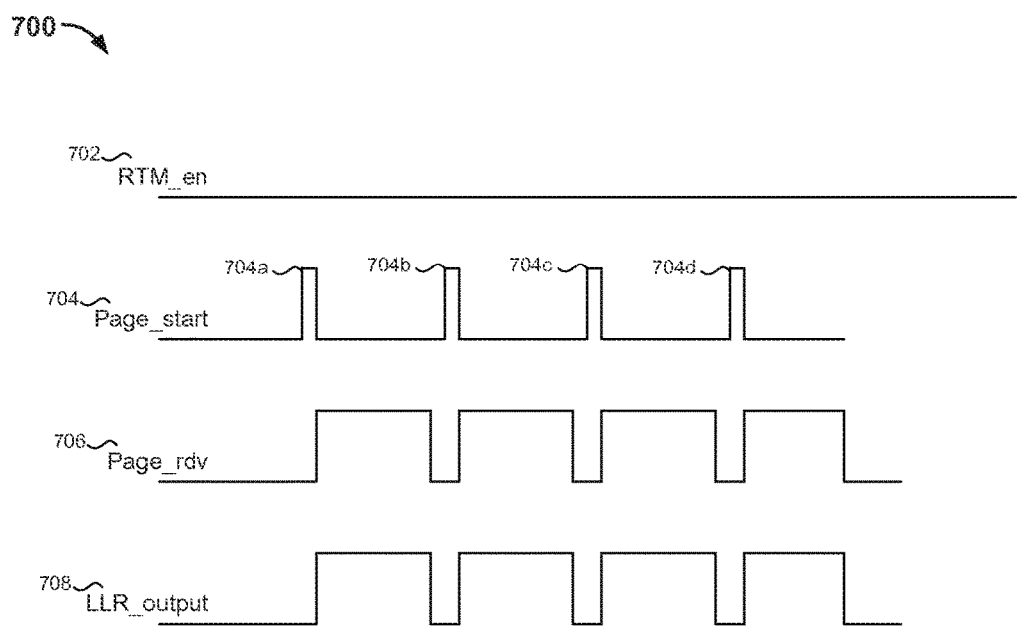
FIG. 7 shows an illustrative timing diagram of decoding hardware operating in a non-retry mode, in accordance with an embodiment of the present disclosure.

FIG. 7 shows an illustrative timing diagram 700 of decoding hardware operating in a non-retry mode, in accordance with an embodiment of the present disclosure. Timing diagram 700 may illustrate the operation of soft information generator 110 during "regular" operation, i.e., in non-retry mode. Timing diagram 700 includes mode indicator signal 702, page start indicator signal 704, page validity signal 706, and LLR output signal 708. Mode indicator signal 702 may indicate whether the system is currently operating in normal (i.e., non-retry mode) or in retry mode. Since timing diagram 700 illustrates the system's operation in normal mode, mode indicator signal 702 is equal to zero throughout the time period shown in FIG. 7. Page indicator signal 704 is a gating signal which denotes the beginning of a data segment or page by one of pulses 704a-704d. For example, page indicator signal 704 indicates the beginning of four respective pages over the time period shown in FIG. 7. Page validity signal 706 may indicate when read data is available for processing by soft information generator 110. In some implementations, there may be a short delay between a pulse of mode indicator signal 702 and a pulse of page validity signal 706. This short delay may be required in order to allow spurious emissions to settle or to account for some forms of processing delay. LLR output signal 708 may denote when output signals of soft information generator 110 are available. For example, LLR output signal 708 may be used by CPU 104 to schedule processing tasks.

Figure 8:
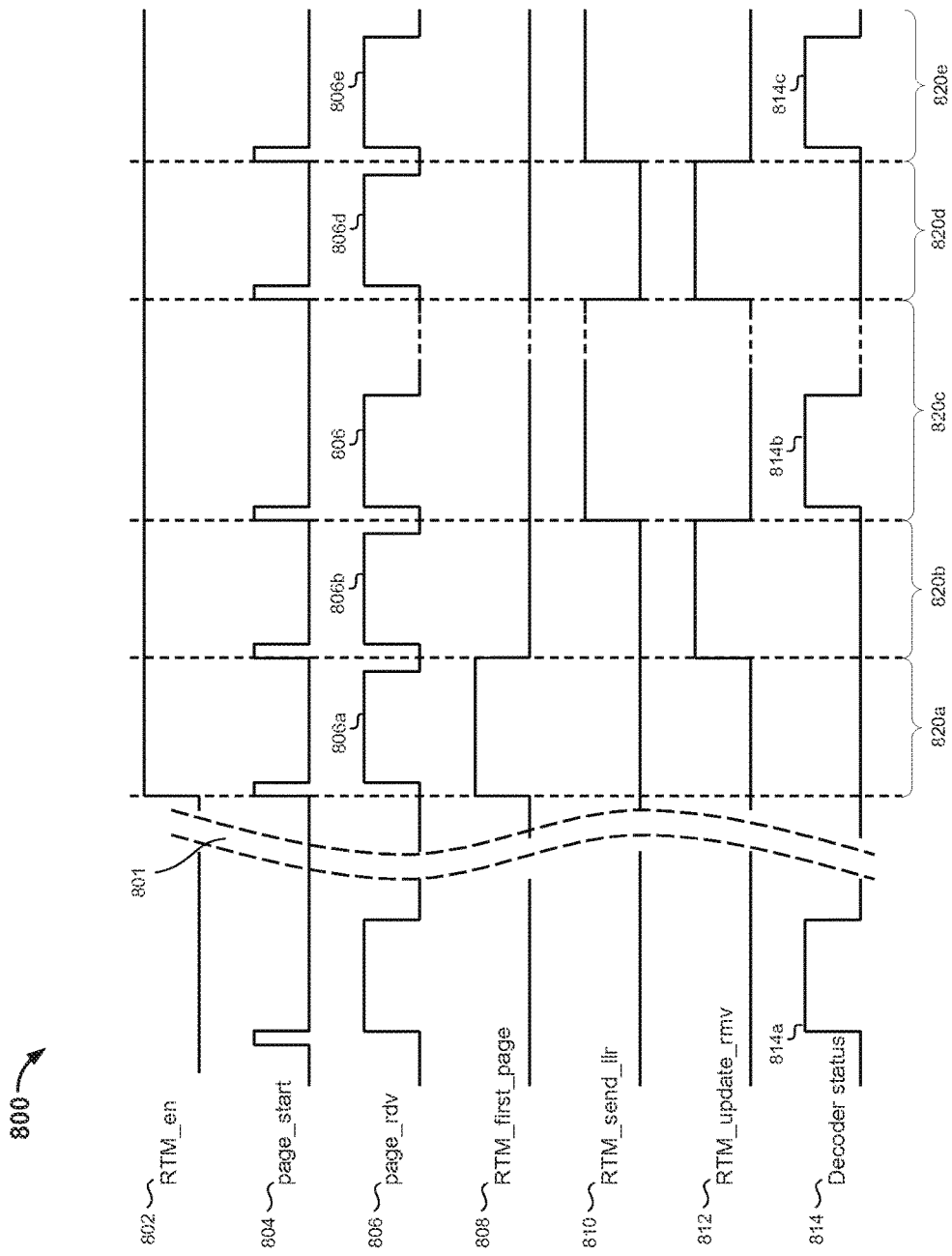
FIG. 8 shows an illustrative timing diagram for using decoding hardware operating in a retry mode, in accordance with some embodiments of the present disclosure.

FIG. 8 shows an illustrative timing diagram for using decoding hardware operating in a retry mode, in accordance with some embodiments of the present disclosure. Timing diagram 800 may include mode indicator signal 802, page start indicator signal 804, page validity signal 806, control signals 808, 810, and 812, as well as decoder status signal 814.

Mode indicator signal 802, page start indicator signal 804, and page validity signal 806 may be similar to mode indicator signal 702, page start indicator signal 704 and page validity signal 706, as is discussed in relation to FIG. 7. However, in contrast to timing diagram 700, timing diagram 800 assumes that decoding using normal operation fails. For example, decoder status signal 814 may indicate using pulse 814a that decoding using the regular operation mode has failed. In some implementations, when decoder 112 fails to decode the signal in the regular operation mode, retry mode may initiated.

Initiating retry mode may require CPU 104 to change the scheduling of commands currently in a decoding pipeline. Accordingly, retry mode may not be initiated immediately upon decoder status signal 814 indicating that decoding has failed. Instead, a pipeline break 801 may be needed in the instructions pipeline, as illustrated in FIG. 8. After pipeline break 801, timing diagram 800 may be partitioned into time periods 820a-820d (generally, time periods 820). During time periods 820a-820b, soft information generator 110 may be configured to generate soft information based on two decision thresholds, one corresponding to a first read operation during time period 820a and one corresponding to a second read operation 820b. Specifically, during time period 820a, control signal 808 indicates that new soft information needs to be generated and therefore resets accumulation register 522, as is discussed in relation to FIG. 5. Control signal 808 remains inactive during the remainder of time periods 820b-820d because decoding of the same data page continues to be processed. During the second read operation in time period 820b, control signal 812 is active, indicating that the reference value needs to be updated. At the end of time period 820b, soft information generator 110 has generated soft information based on the two read operations processed during time interval 820a and 820b. Accordingly, in time period 820c, decoder 112 may perform decoding based on the LLR information. The processing of decoder 112 may be indicated by decoder status signal 814. Timing diagram 800 assumes that second decoding attempt 814b during time period 820c fails. Consequently, another decoding attempt using further refined soft information may be attempted.

In order to further refine the soft information, a third and a fourth read operation may be performed during time interval 820c and 820d, respectively. Similar to time period 820b, control signal 812 is active during time period 820d in order to indicate that the reference value should be generated based on the binary values currently associated with the input signal. During time period 820e, the resulting LLR information is again received by decoder 112 which performs a third decoding attempt 814c. Time diagram 800 assumes that the third decoding attempt, using the further refined soft information is successful. Although not shown in timing diagram 800, more than three decoding attempts may be performed by decoder 112, using even further refined soft information. The control signals shown in time diagram 800 are meant to illustrate the processes that are performed by soft information generator 110. However, additional control signals may be added or some control signals may be removed or combined without departing from the scope of the present disclosure.

Figure 9:
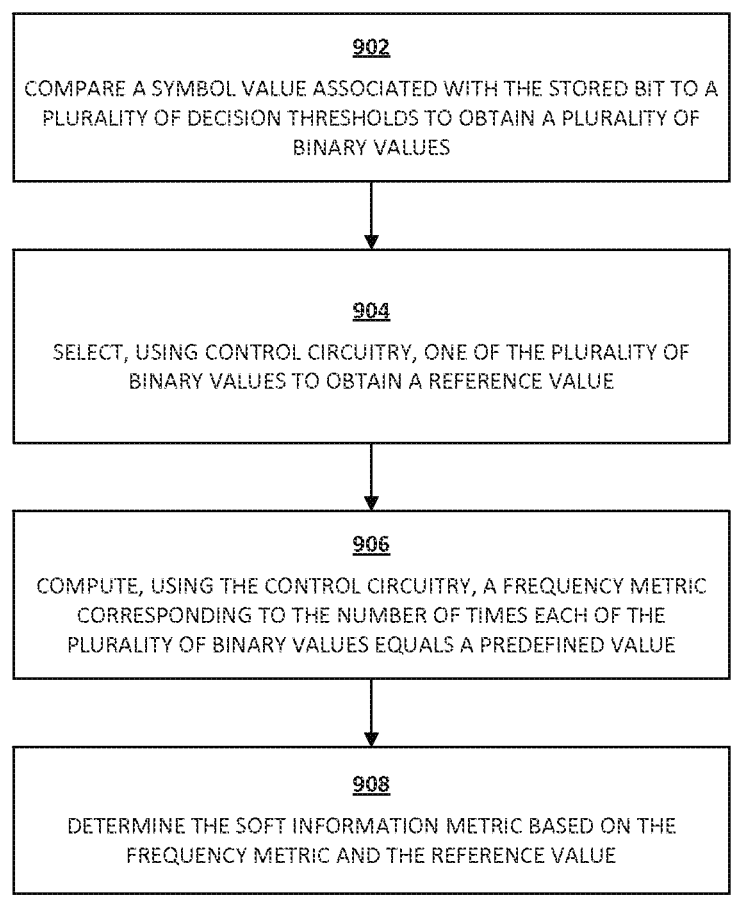
FIG. 9 shows a high-level flow chart for determining soft information in a data storage system, in accordance with some embodiments of the present disclosure.

FIG. 9 shows a high-level flow diagram of a process 900 for determining soft information in a data storage system, in accordance with some embodiments of the present disclosure. Soft information generator 110 may execute process 900 by, at 902, comparing a symbol value associated with a stored bit to a plurality of decision thresholds to obtain a plurality of binary values. Process 900 may, at 904, select, using control circuitry, one of the plurality of binary values to obtain a reference value. At 906, process 900 may compute, using the control circuitry, a frequency metric corresponding to the number of times each of the plurality of binary values equals a predefined value. Process 900 may, at 908, determine the soft information metric based on the frequency metric and the reference value.

At 902, a symbol value associated with a stored bit is compared to a plurality of decision thresholds to obtain a plurality of binary values. The symbol value may correspond to a modulation symbol that represents any number of bits, such as one bit (as shown in diagram 200) or two bits (as shown in diagram 250). The symbol value may be modulated using any suitable type of modulation scheme, for example pulse-amplitude modulation as illustrated in FIG. 2. The symbol value may be retrieved from flash device 102 using NAND interface 106 or using any other suitable mechanism for accessing flash memory 102. The retrieved symbol value may be compared to a plurality of decision thresholds, as is discussed in relation to FIG. 2 and FIG. 3, and a plurality of binary values may be obtained.

At 904, a reference value may be obtained by selecting one of the plurality of binary values corresponding to a predefined one of the plurality of decision thresholds. For example, the binary value corresponding to the rightmost decision threshold may be used, although any other decision threshold may be used alternatively without departing from the scope of the present disclosure. The reference value may be obtained using reference value determination circuitry 542. For example, the reference value may be identified based on a gating signal, such as gating signal 530 ("RTM_update_rmv").

At 906, a frequency metric corresponding to the number of times the plurality of binary values equals a predefined value may be obtained. In some implementations, the frequency metric may be obtained by frequency metric accumulation circuitry 540. The frequency metric may be obtained by counting the number of times that a reference value (e.g., either logical zero or logical one) occurs in the bit sequences associated with the decision thresholds. The number of occurrences of the reference value may be counted by buffering a binary input signal in buffer register 506. For each bit location in the buffer register, the bit value may be compared to the reference value, and when both are equal, an accumulation register may be incremented. In some implementations, the content of accumulation registers may be stored in a bin index memory, for example to collect histogram data to be retrieved at a later point in time.

At 908, a soft information metric may be determined based on the frequency metric and the reference value. In some implementations, the soft information metric may be determined by lookup table circuitry 404. For example, the frequency metric and the reference value obtained at 904 and 906, respectively, may be converted (or "remapped") to a single index. The resulting index value may be used to uniquely identify an element in a lookup table. For example, the index value may identify a unique memory location in a stored lookup table and a soft information metric, stored at that index value may be retrieved. The soft information metric may then be output by soft information generator 110 and used by decoder 112 to decode the retrieved data.

In some embodiments, process 900 may be repeated several times, for example until decoder 112 successfully decodes the data. In particular, soft information generator 110 may initially generate soft information with a low accuracy by using a first number of decision thresholds that is relatively small. In some scenarios, the soft information metric thus generated may be insufficient for successful decoding by decoder 112. If decoding is not successful, soft information generator 110 may generate more accurate soft information by utilizing a second number of decision thresholds, wherein the second number of decision thresholds is larger than the first number of decision thresholds. This leads to more accurate soft information and decoder 112 may be able to decode the retrieved data based on the more accurate soft information. In some implementations, a single decision threshold may be used in an initial decoding attempt (e.g., in a non-retry mode), and only hard information may be computed in this initial decoding attempt. If initial decoding based on hard information proves unsuccessful, soft information may be generated and used in a second decoding attempt (e.g., in retry mode).

Figure 10:
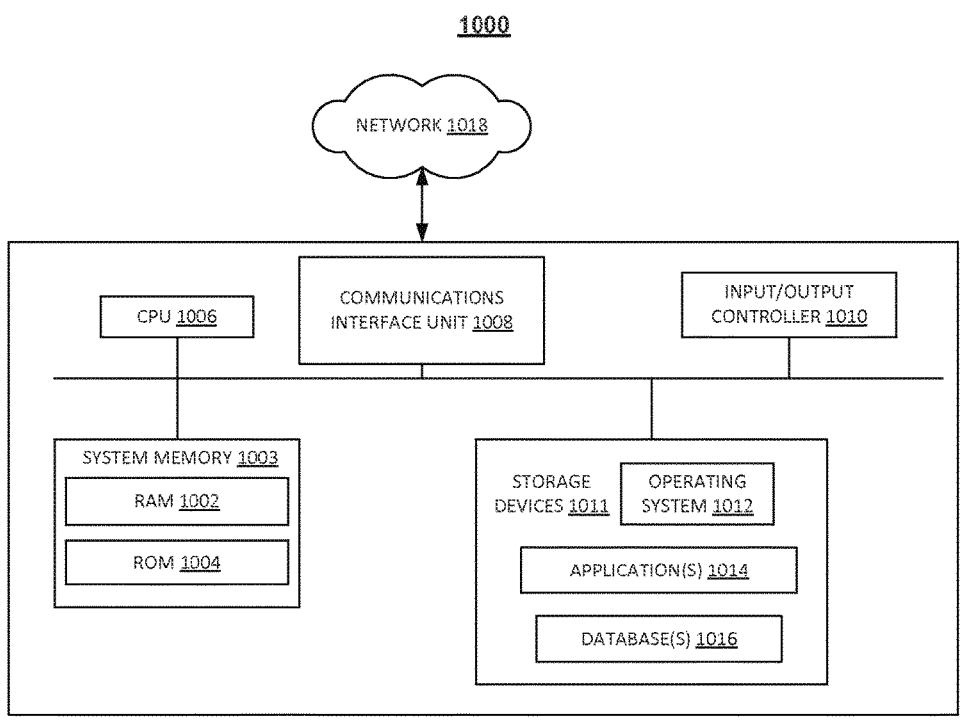
FIG. 10 shows a block diagram of a computing device, for performing any of the processes described herein, in accordance with some embodiments of the present disclosure.

FIG. 10 is a block diagram 1000 of a computing device, such as any of the components of the system of FIG. 4, for performing any of the processes described herein, in accordance with some embodiments of the present disclosure. Each of the components of these systems may be implemented on one or more computing devices 1000. In certain aspects, a plurality of the components of these systems may be included within one computing device 1000. In certain embodiments, a component and a storage device 1011 may be implemented across several computing devices 1000.

The computing device 1000 comprises at least one communications interface unit 1008, an input/output controller 1010, system memory 1003, and one or more data storage devices 1011. The system memory 1003 includes at least one random access memory (RAM 1002) and at least one read-only memory (ROM 1004). All of these elements are in communication with a central processing unit (CPU 1006) to facilitate the operation of the computing device 1000. The computing device 1000 may be configured in many different ways. For example, the computing device 1000 may be a conventional standalone computer or alternatively, the functions of computing device 1000 may be distributed across multiple computer systems and architectures. In FIG. 10, the computing device 1000 is linked, via network 1018 or local network, to other servers or systems.

The computing device 1000 may be configured in a distributed architecture, wherein databases and processors are housed in separate units or locations. Some units perform primary processing functions and contain at a minimum a general controller or a processor and a system memory 1003. In distributed architecture embodiments, each of these units may be attached via the communications interface unit 1008 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 1006 comprises a processor, such as one or more conventional microprocessors and one or more supplementary co-processors such as math co-processors for offloading workload from the CPU 1006. The CPU 1006 is in communication with the communications interface unit 1008 and the input/output controller 1010, through which the CPU 1006 communicates with other devices such as other servers, user terminals, or devices. The communications interface unit 1008 and the input/output controller 1010 may include multiple communication channels for simultaneous communication with, for example, other processors, servers or client terminals.

The CPU 1006 is also in communication with the data storage device 1011. The data storage device 1011 may comprise an appropriate combination of magnetic, optical or semiconductor memory, and may include, for example, RAM 1002, ROM 1004, flash drive, an optical disc such as a compact disc or a hard disk or drive. The CPU 1006 and the data storage device 1011 each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 1006 may be connected to the data storage device 1011 via the communications interface unit 1008. The CPU 1006 may be configured to perform one or more particular processing functions.

The data storage device 1011 may store, for example, (i) an operating system 1012 for the computing device 1000; (ii) one or more applications 1014 (e.g., computer program code or a computer program product) adapted to direct the CPU 1006 in accordance with the systems and methods described here, and particularly in accordance with the processes described in detail with regard to the CPU 1006; or (iii) database(s) 1016 adapted to store information that may be utilized to store information required by the program.

The operating system 1012 and applications 1014 may be stored, for example, in a compressed, an uncompiled and an encrypted format, and may include computer program code. The instructions of the program may be read into a main memory of the processor from a computer-readable medium other than the data storage device 1011, such as from the ROM 1004 or from the RAM 1002. While execution of sequences of instructions in the program causes the CPU 1006 to perform the process steps described herein, hard-wired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to soft information generation as described herein. The program also may include program elements such as an operating system 1012, a database management system and "device drivers" that allow the processor to interface with computer peripheral devices (e.g., a video display, a keyboard, a computer mouse, etc.) via the input/output controller 1010.

The term "computer-readable medium" as used herein refers to any non-transitory medium that provides or participates in providing instructions to the processor of the computing device 1000 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer may read.

Various forms of computer readable media may be involved in carrying one or more sequences of one or more instructions to the CPU 1006 (or any other processor of a device described herein) for execution. For example, the instructions may initially be borne on a magnetic disk of a remote computer (not shown). The remote computer may load the instructions into its dynamic memory and send the instructions over an Ethernet connection, cable line, or even telephone line using a modem. A communications device local to a computing device 1000 (e.g., a server) may receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only be the claims which follow.

What is claimed is:

1. A method for decoding a stored bit, comprising:
   generating, using a demodulator, a plurality of binary values by comparing a symbol value of a stored bit to a plurality of thresholds, the plurality of binary values corresponding to a decision region bound by one or more of the plurality of thresholds;
   computing, using control circuitry and the plurality of binary values, a frequency metric;
   selecting, using the control circuitry, one of the plurality of binary values as a reference value; and
   determining, using the control circuitry, a soft information metric based on the frequency metric and the reference value.

2. The method of claim 1, wherein the frequency metric corresponds to a number of times a predefined value occurs in the plurality of binary values.

3. The method of claim 1, wherein the reference value corresponds to one of the plurality of binary values that corresponds to a reference threshold of the plurality of thresholds.

4. The method of claim 1, further comprising:
   performing a decoding attempt based on hard information; and
   in response to determining that the decoding attempt has failed, generating the plurality of binary values by comparing the symbol value to the plurality of thresholds.

5. The method of claim 1, wherein the soft information metric is a first soft information metric having a first granularity, the method further comprising:
   performing a decoding attempt based on the first soft information metric; and
   in response to determining that the decoding attempt has failed, generating a second soft information metric having a second granularity, wherein the second granularity is finer than the first granularity.

6. The method of claim 1, wherein the soft information metric is a log-likelihood ratio (LLR) metric.

7. The method of claim 1, wherein determining the soft information metric comprises:
   identifying an index value based on the frequency metric and the reference value; and
   determining the soft information metric from a lookup table based on the index value.

8. The method of claim 1, wherein the number of thresholds in the plurality of thresholds is determined based on a desired granularity of the soft information metric.

9. The method of claim 1, wherein the plurality of thresholds are adapted based on statistics associated with the soft information metric.

10. The method of claim 1, further comprising:
    generating an index value based on the frequency metric and the reference value; and
    storing a histogram of the index value to obtain statistics of the soft information metric.

11. A system for decoding a stored bit, comprising:
    a demodulator configured to generate a plurality of binary values by comparing a symbol value of a stored bit to a plurality of thresholds, wherein the plurality of binary values corresponds to a decision region bound by one or more of the plurality of thresholds; and
    control circuitry configured to:
      compute, using the plurality of binary values, a frequency metric,
      select one of the plurality of binary values as a reference value, and
      determine a soft information metric based on the frequency metric and the reference value.

12. The system of claim 11, wherein the frequency metric corresponds to a number of times a predefined value occurs in the plurality of binary values.

13. The system of claim 11, wherein the reference value corresponds to one of the plurality of binary values that corresponds to a reference threshold of the plurality of thresholds.

14. The system of claim 11, wherein the control circuitry is further configured to:
    perform a decoding attempt based on hard information, and in response to determining that the decoding attempt has failed, generate the plurality of binary values by comparing the symbol value to the plurality of thresholds.

15. The system of claim 11, wherein the soft information metric is a first soft information metric having a first granularity, and the control circuitry is further configured to:
perform a decoding attempt based on the first soft information metric, and
in response to determining that the decoding attempt has failed, generate a second soft information metric having a second granularity, wherein the second granularity is finer than the first granularity.

16. The system of claim 11, wherein the soft information metric is a log-likelihood ratio (LLR) metric.

17. The system of claim 11, wherein the control circuitry is further configured to:
identify an index value based on the frequency metric and the reference value, and
determine the soft information metric from a lookup table based on the index value.

18. The system of claim 11, wherein the number of thresholds in the plurality of thresholds is determined based on a desired granularity of the soft information metric.

19. The system of claim 11, wherein the plurality of thresholds are adapted based on statistics associated with the soft information metric.

20. The system of claim 11, wherein the control circuitry is further configured to:
generate an index value based on the frequency metric and the reference value, and
store a histogram of the index value to obtain statistics of the soft information metric.

* * * * *